United States Patent
Mayr et al.

(10) Patent No.: US 7,468,705 B2
(45) Date of Patent: Dec. 23, 2008

(54) ANTI-RESONANT CIRCUIT ARRANGEMENT

(75) Inventors: Josef Mayr, Schwindegg (DE); Norbert Friese, Taufkirchen (DE)

(73) Assignee: MD Elektronik GmbH, Waldkraiburg (DE)

(*) Notice: Subject to any disclaimer, the term of this patent is extended or adjusted under 35 U.S.C. 154(b) by 891 days.

(21) Appl. No.: 11/036,188

(22) Filed: Jan. 14, 2005

(65) Prior Publication Data

US 2005/0202794 A1     Sep. 15, 2005

(30) Foreign Application Priority Data

Jan. 14, 2004   (DE)  ...................... 10 2004 001 899

(51) Int. Cl.
*H01Q 1/00* (2006.01)
*H01Q 1/32* (2006.01)

(52) U.S. Cl. .................. 343/722; 343/713; 343/745

(58) Field of Classification Search .............. 343/713, 343/722, 745, 749; 455/193.1
See application file for complete search history.

(56) References Cited

U.S. PATENT DOCUMENTS

| | | | |
|---|---|---|---|
| 3,123,664 A | | 3/1964 | Logan |
| 3,524,410 A | * | 8/1970 | Erath et al. .................. 102/214 |
| 4,086,594 A | | 4/1978 | Kropielnicki et al. |
| 4,922,801 A | | 5/1990 | Jaquard et al. |
| 5,959,582 A | * | 9/1999 | Kawahata et al. ...... 343/700 MS |
| 6,037,907 A | * | 3/2000 | Ha et al. ...................... 343/752 |
| 6,491,528 B1 | | 12/2002 | McLean |
| 6,762,521 B2 | | 7/2004 | Peter et al. |
| 7,375,695 B2 | * | 5/2008 | Ishizuka et al. ............. 343/745 |

FOREIGN PATENT DOCUMENTS

| | | |
|---|---|---|
| DE | 37 18 172 A1 | 12/1988 |
| DE | 198 04 170 A1 | 8/1999 |
| DE | 100 63 619 A1 | 6/2002 |
| EP | 0 355 424 A2 | 2/1990 |
| EP | 0 762 549 A2 | 3/1997 |
| EP | 1 296 417 A1 | 3/2003 |
| JP | 60-158730 A | 8/1985 |
| JP | 2000-013166 A | 1/2000 |
| JP | 2003-8322 A | 1/2003 |

OTHER PUBLICATIONS

Ludwig, Joachim, "Mechanische Aufbausysteme elektronischer Gerate," Konstruktive Gestaltung und Fertigung in der Elektronik, vol. 2, 1983, pp. 65-76.

(Continued)

*Primary Examiner*—Tan Ho
(74) *Attorney, Agent, or Firm*—Brinks Hofer Gilson & Lione

(57) ABSTRACT

An anti-resonant circuit arrangement for an antenna wiring system, the anti-resonant circuit arrangement including a first electrical component having a connecting area and a second electrical component, wherein the first and second electrical components combine to produce an anti-resonance effect. An electrical conductor that contacts said connecting area and a support plate having an opening that defines a geometric surface, wherein the connecting area is arranged so that a straight line is defined which is orthogonal to and penetrates the geometrical surface and intersects the connecting area.

27 Claims, 6 Drawing Sheets

OTHER PUBLICATIONS

Freutel, Hans, "Verbindungstechnik elektronischer Gerate," Konstruktive Gestaltung und Fertigung in der Elektronik, vol. 2, 1983, pp. 77-89.

Patent Abstracts of Japan Abstract published by Japanese Patent Office regarding Japanese publication 60158730, vol. 9, No. 325, Dec. 20, 1985, one page.

Patent Abstracts of Japan Abstract published by Japanese Patent Office regarding Japanese publication 2000013166, published 2000, one page.

Patent Abstracts of Japan Abstract published by Japanese Patent Office regarding Japanese publication P2003-8322A, vol. 2003, No. 5, May 12, 2003, one page.

* cited by examiner

ANTI-RESONANT CIRCUIT ARRANGEMENT

RELATED APPLICATION

Applicants claim, under 35 U.S.C. §119, the benefit of priority of the filing date of Jan. 14, 2004 of a German patent application, copy attached, Serial Number 10 2004 001 899.5, filed on the aforementioned date, the entire contents of which is incorporated herein by reference.

BACKGROUND OF THE INVENTION

1. Field of the Invention

The present invention relates to an anti-resonant circuit arrangement for an antenna wiring system, having at least two electrical components, namely a choke and at least one capacitor, which is particularly suitable for being installed in motor vehicles.

2. Discussion of Related Art

Wires for heating rear windows of modern motor vehicles are quite often simultaneously used as an antenna for receiving high-frequency signals. So that switch-on pulses of the rear window heater, for example, do not interfere with the received signals, chokes or inductors of appropriate inductivity and capacitors are often installed in the leads. As a rule, such chokes and capacitors must be protected from external effects in order to prevent damage, or they must be provided with electrical insulation.

In known arrangements, the chokes and capacitors are enclosed in a heat-shrinkable sleeve, or are embedded in a synthetic resin material, as a protection against their surroundings. Furthermore, constructions are also common, wherein the choke has been placed in a housing.

An anti-resonant circuit arrangement is shown in EP 355 424 A2, wherein the associated electrical components are mounted on a printed circuit board. This arrangement has the disadvantage, inter alia, that it is comparatively delicate and can be easily damaged in the course of further production steps, for example.

An anti-resonant circuit arrangement is known from JP 2000 013166 A2, wherein a choke and two capacitors have been placed into a housing. Such an anti-resonant circuit arrangement is relatively costly to produce.

The embodiments of anti-resonant circuit arrangements with a choke and a capacitor so far known, in particular those which are employed in motor vehicles, inter alia have the disadvantage that they are comparatively costly to produce or mount, or that their mechanical structure, or the electrical contact elements, are susceptible to external interference.

OBJECT AND SUMMARY OF THE INVENTION

The present invention is therefore based in part on the object of creating an anti-resonant circuit arrangement with a housing of the type mentioned at the outset, which avoids the mentioned disadvantages and in particular permits a cost-effective assembly, or a technically simple fitting together. It is moreover intended to achieve a high degree of dependability of the operation of the anti-resonant circuit assembly.

In accordance with the present invention, this object is attained by an anti-resonant circuit arrangement for an antenna wiring system, the anti-resonant circuit arrangement including a first electrical component having a connecting area and a second electrical component, wherein the first and second electrical components combine to produce an anti-resonance effect. An electrical conductor that contacts said connecting area and a support plate having an opening that defines a geometric surface, wherein the connecting area is arranged so that a straight line is defined which is orthogonal to and penetrates the geometrical surface and intersects the connecting area.

The above object is also attained by an anti-resonant circuit arrangement for an antenna wiring system, the anti-resonant arrangement including a first electrical component and a second electrical component, wherein the first and second electrical components combine to produce an anti-resonance effect. A support plate having a first opening that receives the first electrical component therein and a second opening that receives the second electrical component therein. The support plate further including a strip that separates the first electrical component from the second electrical component, so that the strip defines a minimum distance between the first electrical component and the second electrical component in order to prevent electrical cross-talk between the first electrical component and the second electrical component.

The anti-resonant circuit arrangement in accordance with the present invention has a support plate with at least one opening, which by its nature defines a geometric surface. At least one connecting area of a choke or of a capacitor is arranged here in such a way that a straight line oriented orthogonally with respect to this surface and penetrating the surface can be created, which intersects this connecting area. Accordingly, at least one connecting area is therefore located in the area of an opening, i.e. above, below or within an opening, for example.

A support plate designed in this way has many advantages with respect to mounting and the functioning of the anti-resonant circuit arrangement. For example, the electrical components, namely a choke and one or several capacitors, can be inserted into the support frame and connected with the appropriate cables in one process step and mechanically connected with the support plate in the same process step.

Because of the good accessibility of the connecting areas of the electrical components, it is possible to provide extremely dependable electrical contacts by simple processes, which lastingly withstand vibrations and shocks without loss of function.

In practical use it is important for the interference-free operation of an anti-resonant circuit arrangement to maintain a minimum distance between the choke and the capacitor. Therefore, in a preferred embodiment of the present invention, the choke and a capacitor are each arranged inside an opening and separated from each other by a strip. In this way the minimum distance for preventing electrical cross-talk between the choke and the capacitor is defined in a simple and effective way by the strip.

The electrical components of the anti-resonant circuit arrangement are advantageously in electrical contact with the appropriate electrical conductors, in particular cables, by a crimping connection. Especially in this connection, some areas of contact strips, for example metal strips, are deformed in a ductile manner for the purpose of a crimping connection around an electrical conductor in the connecting area of the electrical components. In a preferred embodiment of the present invention, a connecting area of the choke and a connecting area of a capacitor are electrically connected with each other by the same contact strip. Thus, preferably one contact strip can be in electrical contact with a connecting area of the choke, a connecting area of the capacitor and a connecting area of a second capacitor, as well as of a cable.

By the special arrangement or orientation of the connecting areas with respect to the openings in the support plate, the connecting areas are accessible from both sides for the crimping process, which provides considerable advantages for mechanical contacting with short clock rates. Added to this is that contacts of the best quality can be achieved because of the easy accessibility of the connecting areas.

Alternatively to this it is also possible to bring the electrical conductors, in particular cables, into contact with the appropriate connecting areas of the electrical components by a soldering process. Here, the arrangement or orientation of the connecting areas with respect to the openings in the support plate has the advantage, inter alia, that an excessive heat input from the soldering process, and therefore damage to the support plate, can be prevented.

Thus, the advantages gained by the present invention reside in particular in that an appropriate anti-resonant circuit arrangement of high quality can be produced and mounted in a cost-effective manner. In particular, following the fixation of the electrical components on the support plate, a comparatively sturdy intermediate product has been made, which can be dependably handled.

Further details and advantages of the anti-resonant circuit arrangement in accordance with the present invention ensue from the following description of an exemplary embodiment by the attached drawings.

DETAILED DESCRIPTION OF THE PREFERRED EMBODIMENTS

Figure 1:
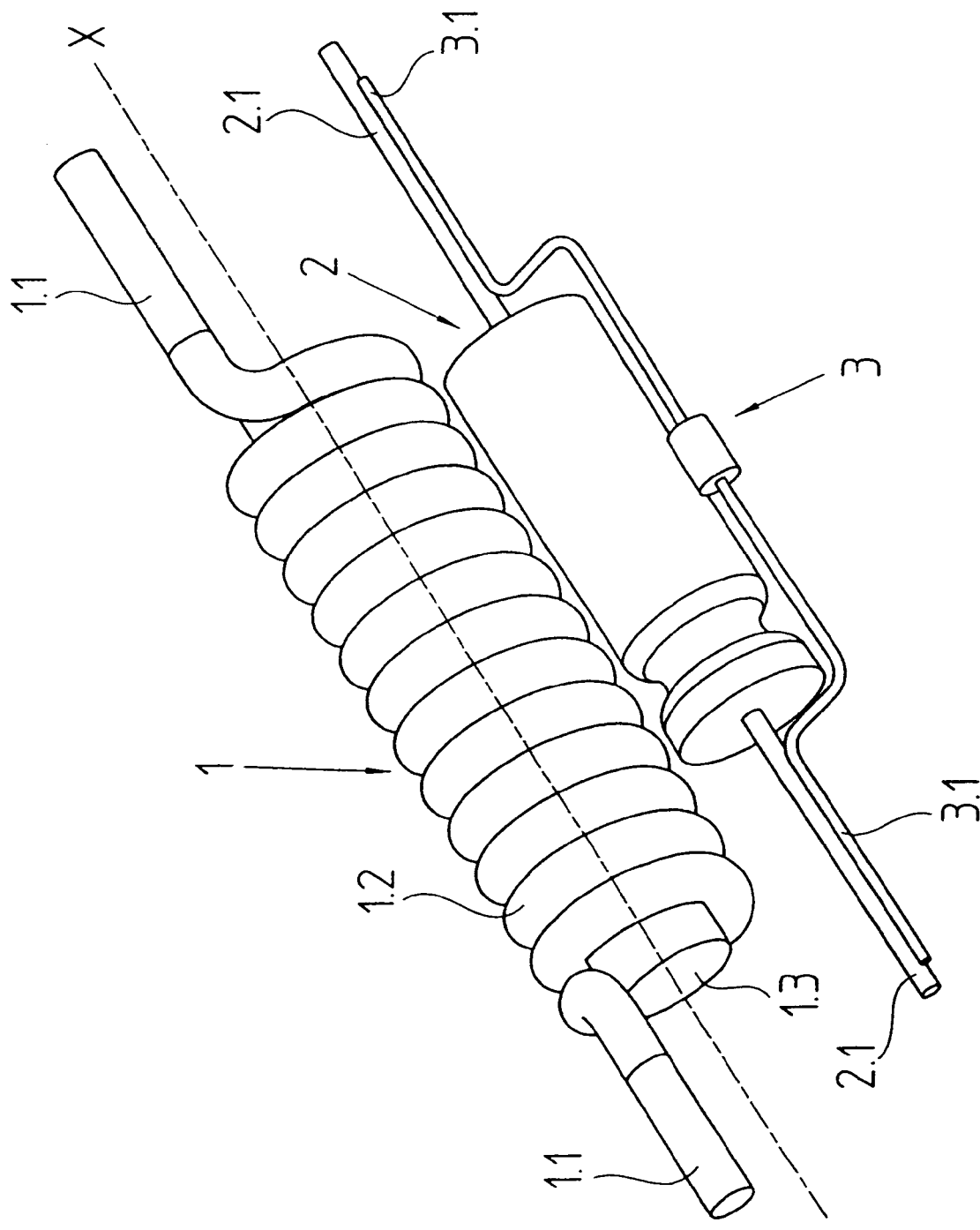
FIG. 1 is a perspective plan view of the electrical components, namely a choke and two capacitors, of an embodiment of an anti-resonant circuit arrangement in accordance with the present invention.

The electrical components of the anti-resonant circuit arrangement in accordance with the exemplary embodiment are represented in FIG. 1.

Inter alia, FIG. 1 shows a plan view of a choke 1, such as is employed in the represented exemplary embodiment of an anti-resonant circuit arrangement in an antenna wiring system of a motor vehicle. The choke 1 includes a copper wire provided with an insulating lacquer, which has been bent around the central axis X along a cylindrical helical line in a large area of the choke 1, so that the windings 1.2 of the choke 1 are helically designed, or the wound area has a helical shape. The windings 1.2 enclose a cylindrical iron core 1.3 and are glued to it for mechanical fixation in place. Furthermore, in accordance with FIG. 1 the choke 1 has two connecting areas 1.1, in which the insulating lacquer has been removed from the copper wire.

The anti-resonant circuit arrangement in accordance with FIG. 1 includes a first capacitor as a further electrical component which, in the exemplary embodiment represented, is embodied as an electrolytic capacitor 2. The electrolytic capacitor 2 has two connecting wires, each with an connecting area 2.1.

An analogous view also applies to a second capacitor of the anti-resonant circuit arrangement which, in the exemplary embodiment represented, is a ceramic capacitor 3. Accordingly, the connecting areas 3.1 of the ceramic capacitor 3 are located at the appropriate wires led out of the ceramic capacitor 3.

Figure 2:
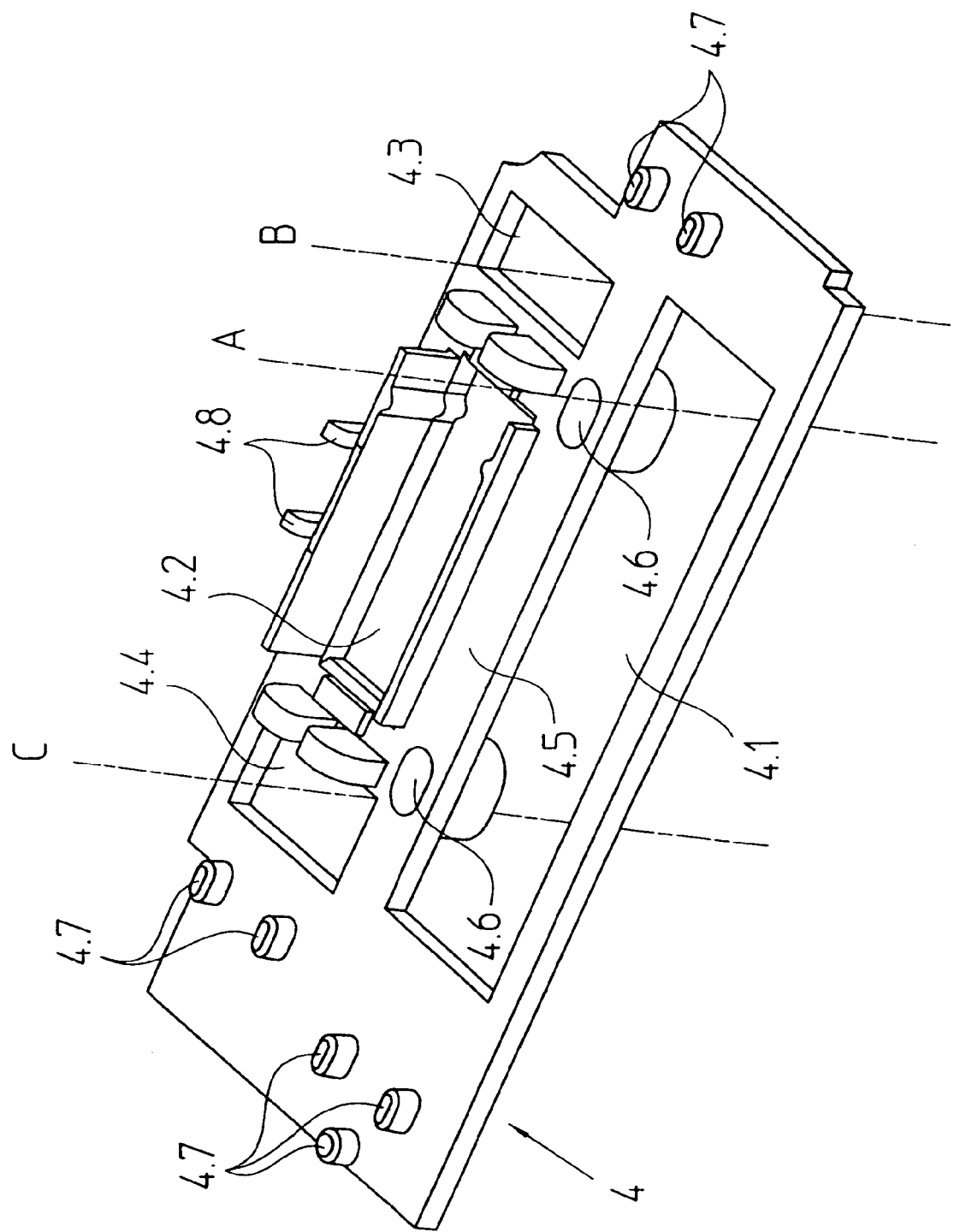
FIG. 2 is a perspective plan view of an embodiment of a support plate to be used with the anti-resonant circuit arrangement of FIG. 1 in accordance with the present invention.

A support plate 4 is represented in FIG. 2 and is used as a further component of the anti-resonant circuit arrangement in accordance with the present invention. The support plate 4 includes an injection-molded element made of an electrically non-conducting thermoplastic material and has several openings 4.1, 4.2, 4.3, 4.4. Each of the openings 4.1, 4.2, 4.3, 4.4 defines a geometric surface. This geometric surface is a flat rectangle for each one of the openings 4.1, 4.2, 4.3, 4.4, each of which comes to rest in the plane of the support plate 4. Straight lines A, B, C have been drawn in FIG. 2, which are oriented orthogonally with respect to the surfaces (rectangles) defined by the openings 4.1, 4.3, 4.4 and penetrate the associated surfaces (rectangles). Thus, in the exemplary embodiment represented, the straight lines A, B. C all extend parallel with respect to each other and are moreover orthogonally oriented with respect to the plane of the support plate 4.

Furthermore, the support plate 4 contains centering bores 4.6, knobs 4.7 and holding bases 4.8. These elements, as well as the openings 4.1, 4.2, 4.3, 4.4, perform important tasks in connection with the assembly of the anti-resonant circuit arrangement, which will be further explained further down below.

Before the electrical components are mounted in the support plate 4, a flat-plug tab 7 (see FIG. 3) is electrically conductively fastened by a welding process on one of the connecting areas 1.1 of the choke 1, on which later a complementary socket can be placed in an electrically conductive manner.

Figure 3:
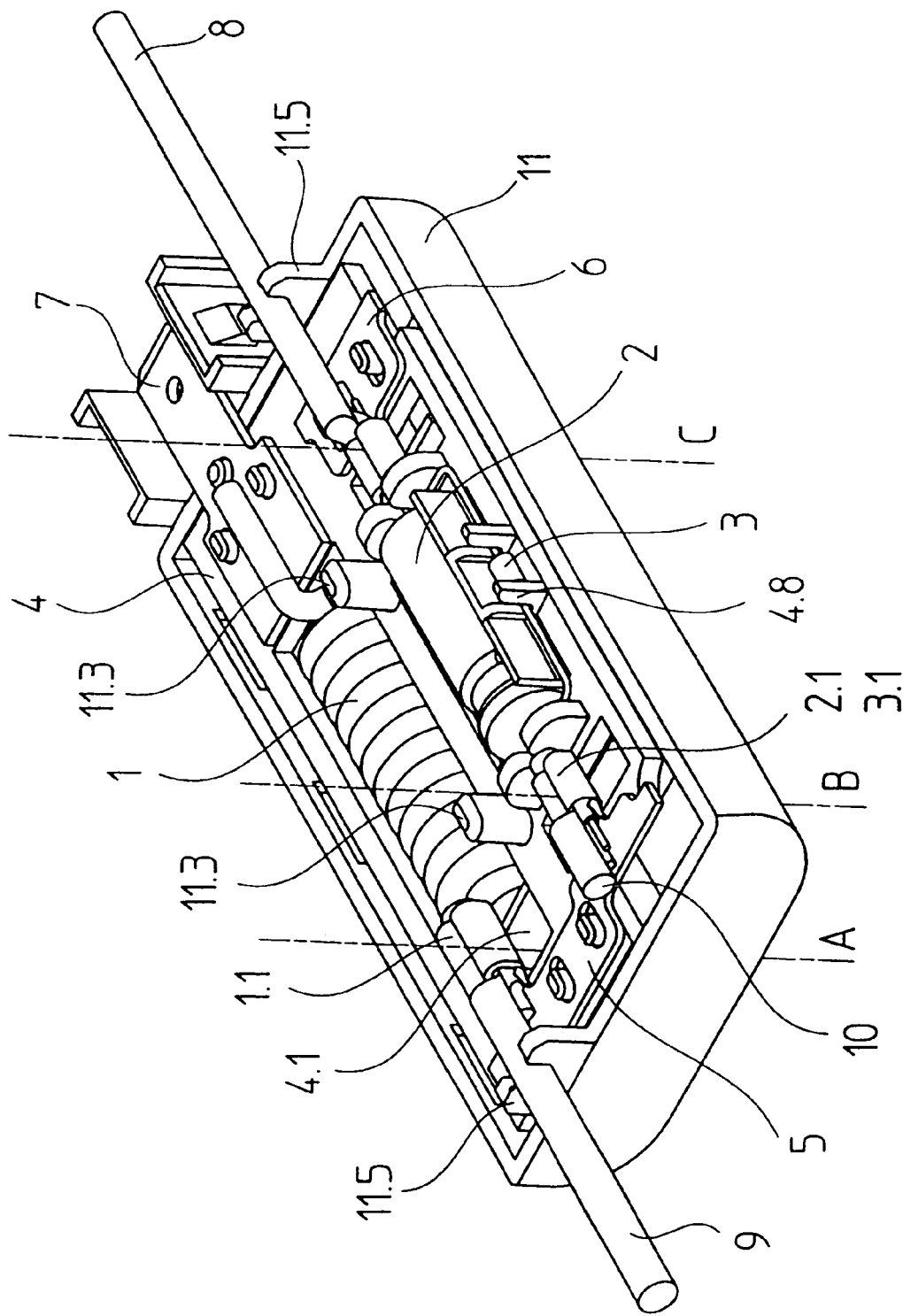
FIG. 3 is a perspective plan view of the support plate of FIG. 2 with embodiments of mounted electrical components and a housing element used with the anti-resonant circuit arrangement of FIG. 1 in accordance with the present invention.

In preparation for the mounting of the electrical components on the support plate 4, initially a first metal strip 5 and a second metal strip 6 are placed on the support plate 4 (FIG. 3). In the process, knobs 4.7 penetrate through corresponding holes in the metal strips 5, 6, so that an exact placement without an extensive adjustment is possible. In this process step, the electrically conductive metal strips are pulled in the form of a tape material off rolls. In the areas in which they will later be deformed for the crimping connection, they have substantially a V-shaped form. Then, in the course of the assembly of the anti-resonant circuit arrangement, the choke 1 with the flat-plug tab 7 is placed into the cutout 4.1. In the process, the three knobs 4.7 in the extension of the cutout 4.1 penetrate corresponding holes of the flat-plug tab 7. In this way a certain positional fixation of the choke 1 with respect to the support plate 4 is already provided in this phase. The axis X of the choke 1 is here aligned in such a way that it has a directional component parallel with the plane of the support plate 4. In the example represented, the axis X extends practically parallel with respect to the plane of the support plate 4. The connecting area 1.1 of the choke 1, which has not yet been brought into contact with the flat-plug tab 7, is now located above the opening 4.1 and rests on the metal strip 5.

Analogously to this, the electrolytic capacitor 2 is plugged into the opening 4.2. In the course of this, every connecting wire of the electrolytic capacitor 2 is fixed in place between a pair of holding strips, so that the two connecting areas 2.1 of the electrolytic capacitor 2 are located above the openings 4.3 or 4.4. In this case the connecting areas 2.1 simultaneously rest on the appropriate V-shaped areas of the first metal strip 5 and the second metal strip 6.

Subsequently, the ceramic capacitor 3 is inserted with its wires into the holding bases 4.8. The connecting wires of the ceramic capacitor 3 are bent in such a way that the connecting areas 3.1 of the ceramic capacitor 3 come to lie in the vicinity of the connecting areas 2.1 of the electrolytic capacitor 2. Therefore the connecting areas 3.1 of the ceramic capacitor 3 are also arranged above the openings 4.3 or 4.4 and also rest in the same way on the V-shaped areas of the first metal strip 5 or the second metal strip 6.

Following this, the support plate 4 with the two metal strips 5, 6 and the choke 1, as well as the electrolytic capacitor 2 and the ceramic capacitor 3, are taken to a crimping machine. In the crimping machine, the two metal strips 5, 6 are deformed in a ductile manner around respective electrical conductors, in this case cables 8, 9, 10, in areas, i.e. in those places where the connecting areas 1.1, 2.1, 3.1 rest on them (V-shaped areas). In the exemplary embodiment represented, roller crimping in particular is performed, wherein the cables 8, 9, 10 are fed to the crimping machine. In this case, three crimping connections are simultaneously produced. The short piece of the cable 10, with which a connecting area 2.1 of the electrolytic capacitor 2 and a connecting area 3.1 of the ceramic capacitor 3 are brought into contact, incidentally has only the purpose of making possible a dependable crimped connection because of its elasticity, or deformability, at this location.

In this crimping step, the arrangement with the support plate 4 has been shown to be particularly advantageous. First, because the support plate 4 assures the exact relative positioning of the two metal strips 5, 6, of the choke 1, as well as the electrolytic capacitor 2 and the ceramic capacitor 3 with respect to each other. Moreover, it is possible to position the support plate 4 in the crimping machine exactly fitted and quickly by the contact faces. Thereafter, the crimping tools can approach the respective connecting areas 1.1, 2.1, 3.1 of the choke 1, of the electrolytic capacitor 2 and of the ceramic capacitor 3 along lines A, B and C at both sides of the support plate 4 and dip into the openings 4.1, 4.3, 4.4. In the process, a roll-up movement of the two metal strips 5, 6 is performed in the connecting areas 1.1, 2.1, 3.1.

Simultaneously with the crimping process, a mechanical fastening of the two metal strips 5, 6 on the support plate 4 is also performed. To this end, the knobs 4.7 are subject to a pressing force in the direction toward the center plane of the support plate 4 by a plunger, so that the knobs 4.7 are deformed in a ductile manner. Accordingly, a positive connection of the metal strips 5, 6 with the support plate 4 is produced.

Following these work steps, which occur almost simultaneously in a single production device, a compact unit including the support plate 4, electrical components and cables 8, 9 has been made in a short processing time. This unit can be dependably prefabricated, stored and transported.

The mounting of the premounted support plate 4 on a first housing element 11 follows as the next production step in accordance with FIG. 3. To this end, the premounted support plate 4 is inserted into the first housing element 11, and the cables 8, 9 are pushed into the cable clips 11.5 of the first housing element 11.

It can also be seen in FIG. 3 that the connecting area 1.1 of the choke 1 is arranged in such a way that the straight line A intersects this connecting area 1.1 and its associated opening 4.1. The same considerations apply to the straight lines B and C, which intersect the connecting area 2.1 of the electrolytic capacitor 2 and the connecting area 3.1 of the ceramic capacitor 3, and at the same time penetrate the associated openings 4.3, 4.4 (or the surfaces defined by the openings 4.3, 4.4, in particular rectangles). Note that the connecting areas 1.1, 2.1 and 3.1 are positioned either beneath, above or in the associated openings 4.1, 4.3 and 4.4, respectively, in order to allow the crimping tool to penetrate through the support plate. This geometric interrelationship assures the good accessibility of the connecting areas 1.1, 2.1 for the crimping tools, so that this high-quality and rugged contacting along with minimal production times is possible. Incidentally, in the represented exemplary embodiment, the connecting areas 2.1 of the electrolytic capacitor 2 and the connecting areas 3.1 of the ceramic capacitor 3 are coincident to a large degree.

It can be furthermore seen in FIG. 3 that the metal strip 5 is in electrical contact with the connecting area 1.1 of the choke 1, the connecting area 2.1 of the electrolytic capacitor 2 and the connecting area 3.1 of the ceramic capacitor 3, as well as with the cable 9. In this way the electrical contact with each other of these elements has been achieved with a minimum outlay of materials and manufacturing.

It is important for the good and dependable functioning of the anti-resonant circuit arrangement that an electrical crosstalk between the choke 1 and the capacitor arranged next to the choke 1, in this case the electrolytic capacitor 2, is prevented. It has now been found that for this purpose it is necessary to maintain a minimum distance between the electrical components involved. This minimum distance between the choke 1 and the electrolytic capacitor 2 is defined by the width of the strip 4.5, since the choke 1 and the electrolytic capacitor 2 are arranged inside the openings 4.1, 4.2. It is assured in this way that a minimum distance is always maintained, even during or as a result of vibrations and shocks such as are customary in the course of the operation of such an anti-resonant circuit arrangement in motor vehicles.

Figure 4:
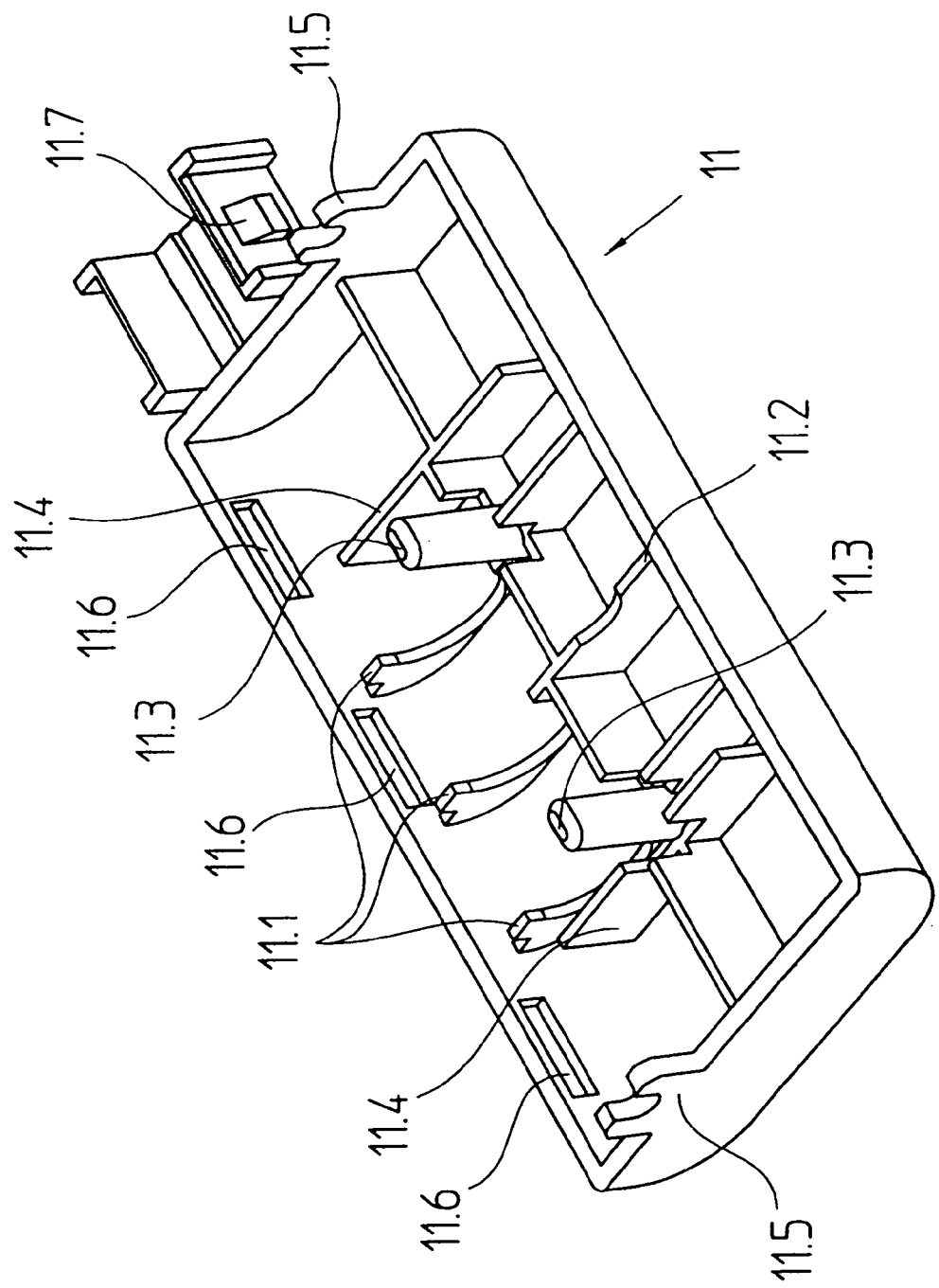
FIG. 4 is a perspective plan view of the inside of the housing element of FIG. 3.

The design of the first housing element 11 also contributes to the insensitivity to vibrations of the anti-resonant circuit arrangement. A perspective plan view in accordance with FIG. 4 substantially represents the inside of the first housing element 11. Several strips 11.1, 11.2, 11.4 are provided there for fixing the choke 1 and the electrolytic capacitor 2 in place. In this case, the strips 11.4 are intended to protect the choke 1 against displacement in the direction of its X axis. The strip 11.2 is provided for radially securing the electrolytic capacitor 2. Analogously to this, the strips 11.1 can radially support the choke 1.

Figure 5:
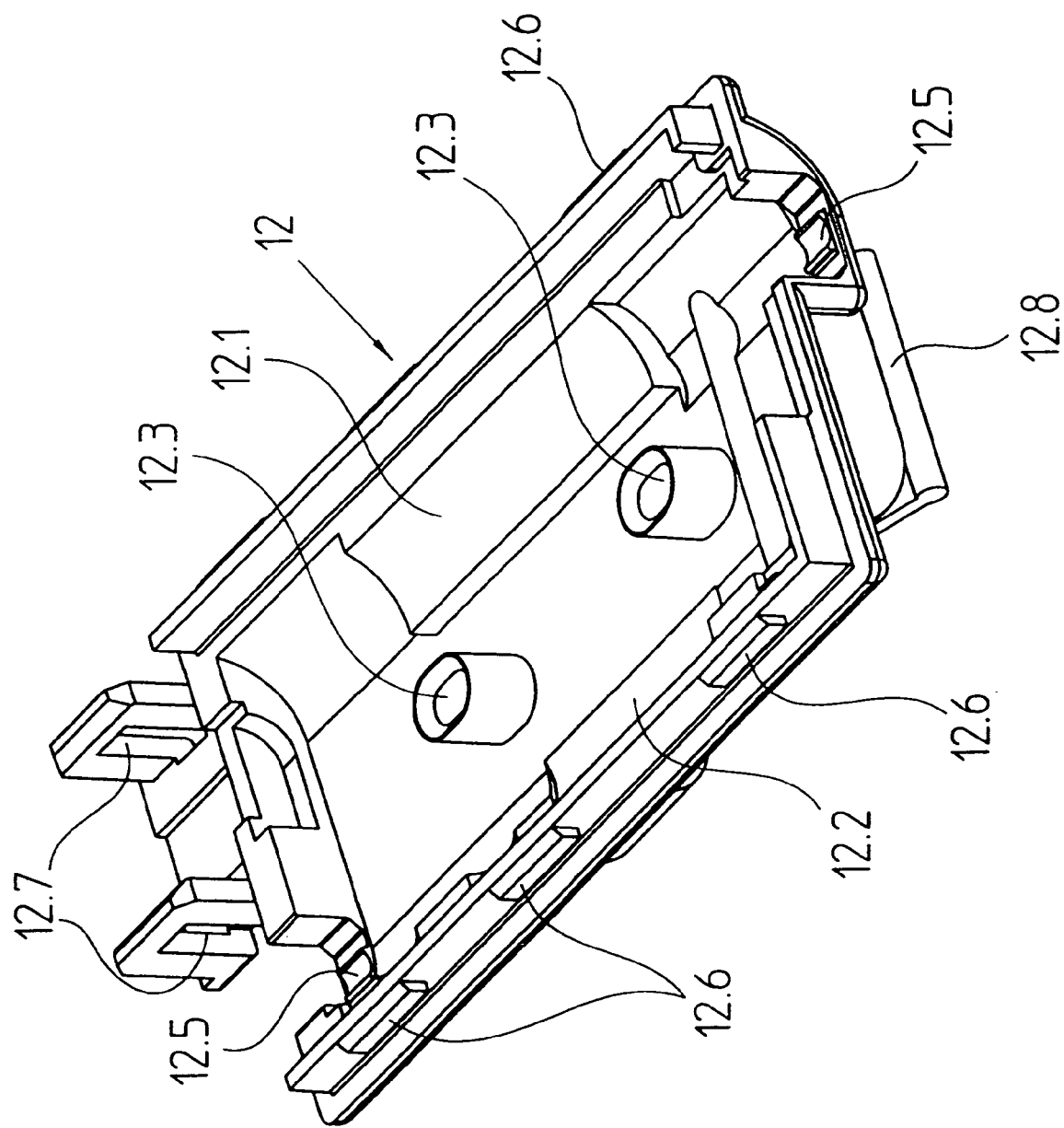
FIG. 5 is a perspective plan view of the inside of an embodiment of a second housing element used with the anti-resonant circuit arrangement of FIG. 1 in accordance with the present invention.
Figure 6:
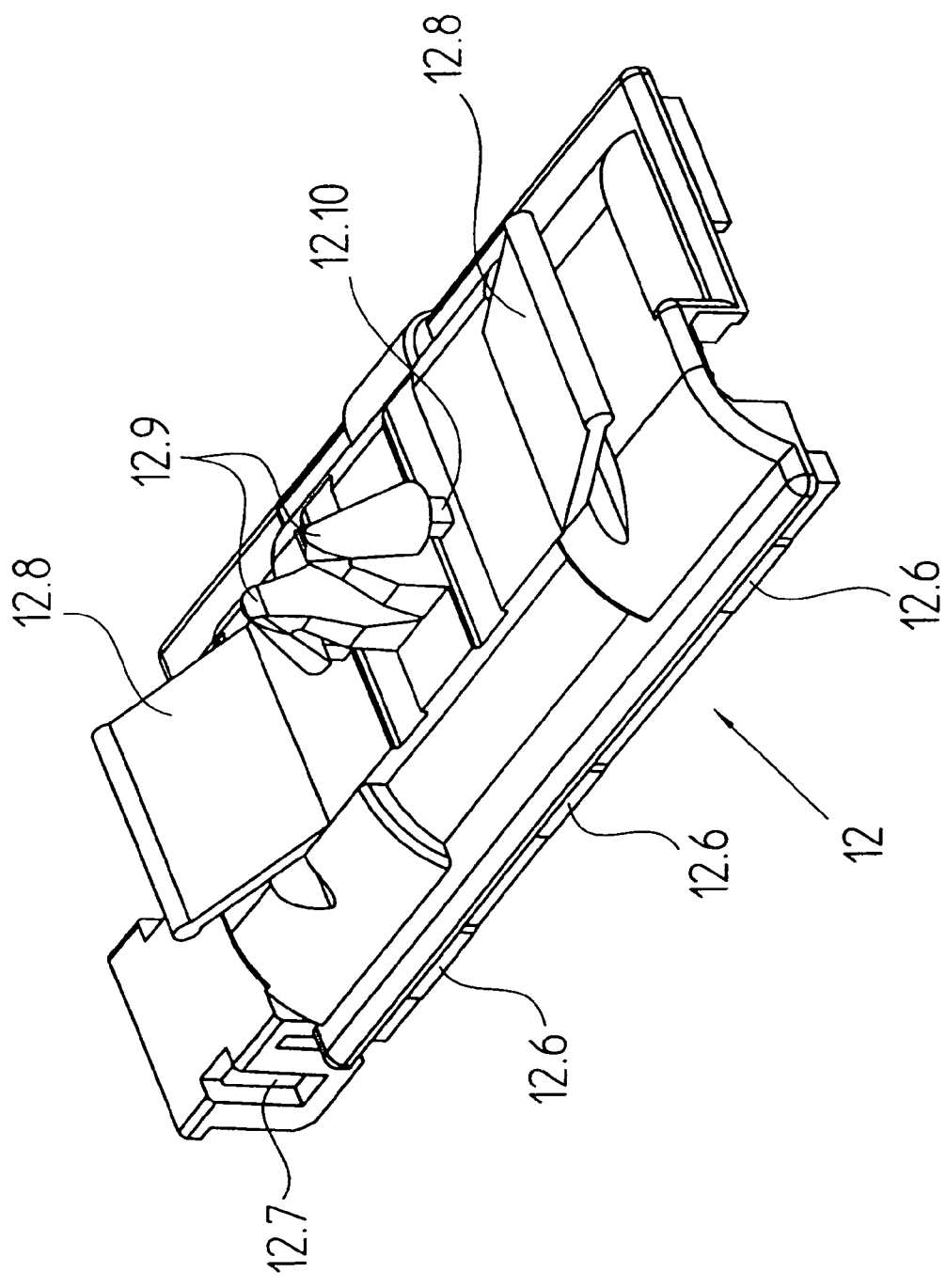
FIG. 6 is a perspective plan view of the outside of the second housing element of FIG. 5.

So that it becomes possible to provide radially directed forces with respect to the choke 1 and the electrolytic capacitor 2, reaction forces are required, which are introduced by a second housing element 12 (see FIGS. 5, 6). For this purpose, six clip recesses 11.6 and two clip protrusions 11.7 are provided in the first housing element 11, which make possible a clip connection with the second housing element 12.

In accordance with FIG. 5, clip protrusions 12.6 and clip windows 12.7 are arranged on the second housing element 12, which are effectively employed, together with the corresponding clip recesses 11.6 and clip protrusions 11.7, for the mechanical connection of the two housing elements 11, 12. Thus, the choke 1, the electrolytic capacitor 2, the ceramic capacitor 3 and the support plate 4 are enclosed in a housing including the two housing elements 11, 12. In this case the two housing elements 11, 12 are of such a size that the strip 11.2, or the strips 11.1, push the electrolytic capacitor 2, or the choke 1, without play and pre-tensed against contact faces 12.1 or 12.2 on the inside of the second housing 12 when the housing elements 11, 12 have been clipped together. In this way an anti-resonant circuit arrangement, which is extremely insensitive to vibrations is created, while the generation of noise, for example rattling, of the anti-resonant circuit arrangement during the operation of a motor vehicle in which the anti-resonant circuit arrangement has been installed is prevented.

Furthermore, the relative position between the choke 1 and the electrolytic capacitor 2 is further fixed by the strips 11.1, 11.2, 11.4, as well as the contact faces 12.1 or 12.2. This means that the inside of the housing element 11 has been laid out in such a way that the latter presses the choke 1 against the second housing element 12 and the support plate 4, so that an installation free of play of the choke 1 is achieved, and the relative position between the choke 1 and the electrolytic capacitor 2 is fixed.

Moreover, the second housing element 12 also contains the cable clamp 12.5, by which the cables 8, 9 are fixed, free of play, at the entry to the housing. Two pegs, which have centering openings 12.3, are located on the inside of the second housing element 12. These centering openings 12.3 are provided for receiving the centering pins 11.3 of the first housing element, so that a simple and exactly fitting mounting of the second housing element 12 on an arrangement is possible in a production phase in accordance with FIG. 3. Incidentally, in the represented exemplary embodiment the housing elements 11, 12 are made of an electrically non-conducting material, namely a polymer, with the aid of an injection molding process.

For the exact positioning of the first housing element 11, the support plate 4 and the second housing element 12, the first housing element 11 has the centering pins 11.3 which, as represented in FIG. 3, penetrate centering bores 4.6 in the support plate 4 and protrude into openings 12.3 (see FIG. 5) of the second housing element 12.

In accordance with FIG. 6, two resilient strips 12.8 and one clip element 12.9, which has two pegs 12.10, are located on the outside of the second housing element 12. When now the anti-resonant circuit arrangement with the clipped-together housing elements 11, 12 is appropriately produced, a simple fastening of the anti-resonant circuit arrangement, for example on a metal or plastic part as the installation face, of a motor vehicle can be provided by their construction. An elongated hole has been prepared to this end in the installation face. The clip element 12.9 is pushed into this elongated hole, wherein the housing is aligned in such a way that the longer axis of the elongated hole extends in the X direction. In the course of this the clip hooks of the clip element 12.9 are elastically pressed together, or deformed, in the X direction. The pegs 12.10 snap into the elongated hole, and the resilient strips 12.8 are elastically bent. Because of their extension behind the clip element 12.9, reaction forces counteract the force of the resilient strips 12.8. A pre-tensed fastening of the anti-resonant circuit arrangement on the installation face is provided in this way.

Thus, the mounting of the anti-resonant circuit arrangement on the installation face can take place in an extremely short time without the use of tools, wherein the housing is automatically aligned axis-parallel in the longitudinal direction of the elongated hole.

The length of the pegs 12.10 is such that it is greater than the thickness of the metal used for the installation face so that, after the anti-resonant circuit arrangement has been mounted, the pegs 12.10 protrude past the corresponding surface of the metal. This protrusion can be used as the engagement face for pliers, by means of which the clip element 12.9 is compressed again in the course of the removal of the anti-resonant circuit arrangement from the installation face.

Further exemplary embodiments exist within the scope of the present invention besides the described examples.

We claim:

1. An anti-resonant circuit arrangement for an antenna wiring system, wherein the anti-resonant circuit arrangement comprises:
    a first electrical component comprising a connecting area;
    a second electrical component, wherein said first electrical component and said second electrical component combine to produce an anti-resonance effect;
    an electrical conductor that contacts said connecting area; and
    a support plate having an opening that defines a geometric surface, wherein said connecting area is arranged so that a straight line is defined which is orthogonal to and penetrates said geometrical surface and intersects said connecting area.

2. The anti-resonant circuit arrangement of claim 1, wherein said first electrical component comprises a choke and said second electrical component comprises a capacitor.

3. The anti-resonant circuit arrangement in accordance with claim 2, wherein said choke comprises a helical winding that winds about an axis that is oriented in such a way that it has a directional component parallel with a plane containing said support plate.

4. The anti-resonant circuit arrangement of claim 1, wherein said first electrical component comprises a capacitor and said second electrical component comprises a choke.

5. The anti-resonant circuit arrangement in accordance with claim 4, wherein said choke comprises a helical winding that winds about an axis that is oriented in such a way that it has a directional component parallel with a plane containing said support plate.

6. The anti-resonant circuit arrangement in accordance with claim 1, wherein said first electrical component is arranged inside a first opening and said second electrical component is arranged inside a second opening so that they are separated from each other by a strip formed in said support plate, so that said strip defines a minimum distance between said choke and said capacitor to prevent electrical cross-talk between each other.

7. The anti-resonant circuit arrangement in accordance with claim 1, further comprising:
    an electrical conductor electrically connected to said first electrical component at said connecting area; and
    a contact strip positioned on said support plate, wherein a portion of said contact strip is deformed in a ductile manner around said electrical conductor at said connecting area so as to define a crimped connection.

8. The anti-resonant circuit arrangement in accordance with claim 7, wherein said contact strip electrically connects said connecting area with a second connecting area of said second electrical component.

9. The anti-resonant circuit arrangement in accordance with claim 8, further comprising a third electrical component, wherein said contact strip is electrically connected with said electrical conductor and a third connecting area of said third electrical component.

10. The anti-resonant circuit arrangement in accordance with claim 1, further comprising a housing comprising a first housing element and a second housing element, wherein said first electrical component, said second electrical component and said support plate are each enclosed by said housing.

11. The anti-resonant circuit arrangement in accordance with claim 10, wherein an interior of said first housing element has a structure that presses said first electrical component against said second housing element, so that an installation, free of play, of said first electrical component is achieved and a relative position between said first electrical component and said second electrical component is fixed.

12. The anti-resonant circuit arrangement in accordance with claim 10, wherein said first housing elements comprises strips that engage said first electrical component and press against a contact face of said second housing element.

13. The anti-resonant circuit arrangement in accordance with claim 10, wherein said first housing element and said second housing element are kept together by a clip connection.

14. The anti-resonant circuit arrangement in accordance with claim 10, wherein said first housing element comprises a centering pin that penetrates a centering bore of said support plate and an opening of said second housing element, wherein said centering pin interacts with said support plate and said second housing element so that exact relative positioning of said first housing element, said support plate and said second housing element results.

15. An anti-resonant circuit arrangement for an antenna wiring system, wherein the anti-resonant circuit arrangement comprises:
   a first electrical component;
   a second electrical component, wherein said first electrical component and said second electrical component combine to produce an anti-resonance effect; and
   a support plate having:
      a first opening that receives said first electrical component therein;
      a second opening that receives said second electrical component therein; and
      a strip that separates said first electrical component from said second electrical component, so that said strip defines a minimum distance between said first electrical component and said second electrical component in order to prevent electrical cross-talk between said first electrical component and said second electrical component.

16. The anti-resonant circuit arrangement of claim 15, wherein said first electrical component comprises a choke and said second electrical component comprises a capacitor.

17. The anti-resonant circuit arrangement in accordance with claim 16, wherein said choke comprises a helical winding that winds about an axis that is oriented in such a way that it has a directional component parallel with a plane containing said support plate.

18. The anti-resonant circuit arrangement of claim 15, wherein said first electrical component comprises a capacitor and said second electrical component comprises a choke.

19. The anti-resonant circuit arrangement in accordance with claim 18, wherein said choke comprises a helical winding that winds about an axis that is oriented in such a way that it has a directional component parallel with a plane containing said support plate.

20. The anti-resonant circuit arrangement in accordance with claim 15, further comprising:
   an electrical conductor electrically connected to a connecting area of said first electrical component; and
   a contact strip positioned on said support plate, wherein a portion of said contact strip is deformed in a ductile manner around said electrical conductor at said connecting area so as to define a crimped connection.

21. The anti-resonant circuit arrangement in accordance with claim 20, wherein said contact strip electrically connects said connecting area with a second connecting area of said second electrical component.

22. The anti-resonant circuit arrangement in accordance with claim 21, further comprising a third electrical component, wherein said contact strip is electrically connected with said electrical conductor and a third connecting area of said third electrical component.

23. The anti-resonant circuit arrangement in accordance with claim 15, further comprising a housing comprising a first housing element and a second housing element, wherein said first electrical component, said second electrical component and said support plate are each enclosed by said housing.

24. The anti-resonant circuit arrangement in accordance with claim 23, wherein an interior of said first housing element has a structure that presses said first electrical component against said second housing element, so that an installation, free of play, of said first electrical component is achieved and a relative position between said first electrical component and said second electrical component is fixed.

25. The anti-resonant circuit arrangement in accordance with claim 23, wherein said first housing element comprises strips that engage said first electrical component and press against a contact face of said second housing element.

26. The anti-resonant circuit arrangement in accordance with claim 23, wherein said first housing element and said second housing element are kept together by a clip connection.

27. The anti-resonant circuit arrangement in accordance with claim 23, wherein said first housing element comprises a centering pin that penetrates a centering bore of said support plate and an opening of said second housing element, wherein said centering pin interacts with said support plate and said second housing element so that exact relative positioning of said first housing element, said support plate and said second housing element results.

* * * * *